United States Patent
Croffie (10) Patent No.: US 7,117,475 B2
(45) Date of Patent: Oct. 3, 2006

(54) METHOD AND SYSTEM FOR UTILIZING AN ISOFOCAL CONTOUR TO PERFORM OPTICAL AND PROCESS CORRECTIONS

(75) Inventor: Ebo Croffie, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 259 days.

(21) Appl. No.: 10/848,994

(22) Filed: May 18, 2004

(65) Prior Publication Data

US 2005/0262467 A1    Nov. 24, 2005

(51) Int. Cl.
*G06F 17/50* (2006.01)
(52) U.S. Cl. .......................................... 716/19; 716/21
(58) Field of Classification Search ................. 716/19, 716/21
See application file for complete search history.

(56) References Cited

U.S. PATENT DOCUMENTS

| | | | | |
|---|---|---|---|---|
| 5,723,233 A | | 3/1998 | Garza et al. | 430/5 |
| 6,881,523 B1* | | 4/2005 | Smith | 430/5 |
| 6,934,010 B1* | | 8/2005 | Smith | 355/69 |
| 7,016,017 B1* | | 3/2006 | Hansen | 355/67 |
| 2002/0186356 A1* | | 12/2002 | Smith | 355/53 |

* cited by examiner

*Primary Examiner*—Sun James Lin
(74) *Attorney, Agent, or Firm*—Strategic Patent Group (57) ABSTRACT

A method and system for performing optical proximity correction (OPC) on an integrated circuit (IC) mask design is disclosed. The system and method of the present invention includes identifying a feature in the IC mask design, generating an isofocal contour for the identified feature, wherein the isofocal contour is a continuum of isofocal points corresponding to points on an edge of the identified feature, and utilizing the isofocal contour to estimate an amount of correction needed to produce a resist image significantly identical to the identified feature.

27 Claims, 10 Drawing Sheets

METHOD AND SYSTEM FOR UTILIZING AN ISOFOCAL CONTOUR TO PERFORM OPTICAL AND PROCESS CORRECTIONS

FIELD OF THE INVENTION

The present invention relates to integrated circuit fabrication, and more particularly to improved methods and systems for performing optical and process corrections.

BACKGROUND OF THE INVENTION

The minimum feature sizes of integrated circuits (ICs) have been shrinking for years. Commensurate with this size reduction, various process limitations have made IC fabrication more difficult. One area of fabrication technology in which such limitations have appeared is photolithography.

Photolithography involves selectively exposing regions of a resist coated silicon wafer to a radiation pattern, and then developing the exposed resist in order to selectively protect regions of wafer layers.

An integral component of photolithographic apparatus is a "reticle" which includes a pattern corresponding to features at one layer in an IC design. The reticle typically includes a transparent glass plate covered with a patterned light blocking material such as chromium. The reticle is placed between a radiation source producing radiation of a pre-selected wavelength and a focusing lens which may form part of a "stepper" apparatus. Placed beneath the stepper is a resist covered silicon wafer. When the radiation from the radiation source is directed onto the reticle, light passes through the glass (regions not having chromium patterns) projects onto the resist covered silicon wafer to produce photo-generated acid. The resist is typically baked to undergo chemical changes that alter its dissolution properties. Subsequent development process is needed to obtain the relief image on wafer. In this manner, an image of the reticle is transferred to the resist.

As light passes through the reticle, it is refracted and scattered by the chromium edges. This causes the projected image to exhibit some rounding and other optical distortion. Furthermore, resist processing effects during the bake process, such as nonlinear diffusion of the photo-generated acid, exacerbate the pattern distortion on the wafer. Subsequent pattern transfer processing effects, such as etch bias, further degrade the pattern fidelity. While such effects pose relatively little difficulty in layouts with large feature sizes (e.g., layouts with critical dimensions above about 1 micron), they cannot be ignored in layouts having features smaller than about 1 micron. The problems become especially pronounced in IC designs having feature sizes near the wavelength of light used in the photolithographic process.

To remedy this problem, a reticle correction technique known as optical and process corrections (OPC) has been developed. Optical and process corrections involve adding dark regions to and/or subtracting dark regions from a reticle design at locations chosen to overcome the distorting effects of diffraction and scattering. Typically, OPC is performed on a digital representation of a desired IC pattern. First, the digital pattern is evaluated with software to identify regions where optical distortion will result. Then the optical proximity correction is applied to compensate for the distortion. The resulting pattern is ultimately transferred to the reticle glass.

Figure 1:
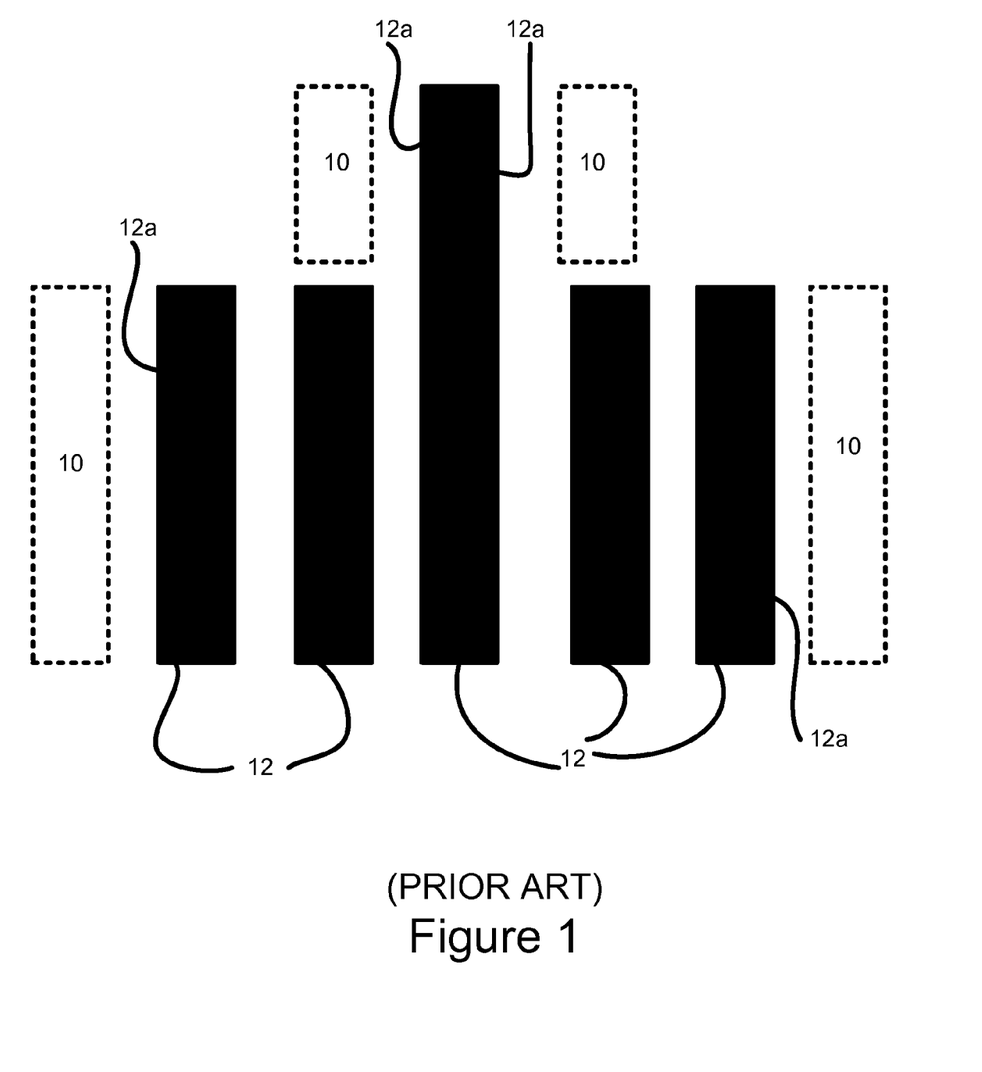
FIG. 1 is a plan view of a test mask utilizing SRAFs.

In addition, a technique related to OPC, which improves the depth of focus, involves the use of modified subresolution assist features (SRAFs). FIG. 1 is an top plan view of a test pattern on a mask utilizing SRAFs. Typically, SRAFs 10 are located near open-ended edges 12a of features 12, although they can be utilized wherever corrections are necessary. SRAFs 10 reduce proximity effects without projecting an image onto the resist.

The degree of correction or the location of a SRAF for a given feature is determined largely by empirical methods. That is, experiments are conducted with reticles having "test" patterns to determine the illumination pattern produced on a wafer by light shown through the test pattern. The deviation between the actual illumination pattern and the desired feature pattern is used to determine how much correction is required for a reticle used to produce the desired feature pattern.

Each correction applies only to the pattern having the exact size and geometry as that tested. If the width of a feature or the separation between features changes, the correction also changes. Thus, given the huge range of IC feature variations, a potentially infinite number of test reticles would have to be produced to account for every pattern that might be encountered. To avoid this cumbersome task, exposure-latitude-based image intensity characteristics, such as image slope, maximum intensity, and minimum intensity, have been utilized to estimate the correction necessary for a particular feature.

While this approach provides some starting point, those skilled in the art will appreciate that lithography process performance is governed by depth-of-focus characteristics as well as exposure latitude. By utilizing only exposure latitude based image intensity characteristics, an undesirably large set of data values is required to ensure adequate modeling. Moreover, exposure latitude based image intensity characteristics provide no guidance as to where to locate SRAFs.

Accordingly, what is needed is an improved system and method for accurately estimating the degree of optical and process correction necessary for a given feature. The system and method should take into consideration exposure latitude and depth of focus characteristics. The present invention addresses such a need.

SUMMARY OF THE INVENTION

The present invention provides an improved method and system for performing optical proximity correction on an integrated circuit (IC) mask design. The system and method of the present invention include identifying a feature in the IC mask design, generating an isofocal contour for the identified feature, wherein the isofocal contour is a continuum of isofocal points corresponding to points on an edge of the identified feature, and utilizing the isofocal contour to estimate an amount of correction needed to produce a resist image significantly identical to the identified feature.

According to the preferred embodiment of the present invention, the isofocal contour is defined by isofocal points corresponding to points on the edge of a feature. The isofocal contour captures depth of focus and exposure latitude information, and is used to improve the OPC process for the feature. By using the isofocal contour as a guide or as an indicator, various OPC processes, e.g., SRAF placement and initial correction estimation, are expedited and less costly.

DETAILED DESCRIPTION

The present invention relates to an improved method and system for performing OPC to an IC mask design. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

According to aspects of the present invention, an isofocal contour around a feature is defined by a continuum of isofocal points corresponding to points on an edge of the feature. The isofocal contour captures both exposure latitude and depth of focus information related to the feature and the resist. Because lithography process performance is governed by exposure latitude and depth of focus characteristics, the isofocal contour is used to optimize various OPC processes and techniques.

Figure 2A:
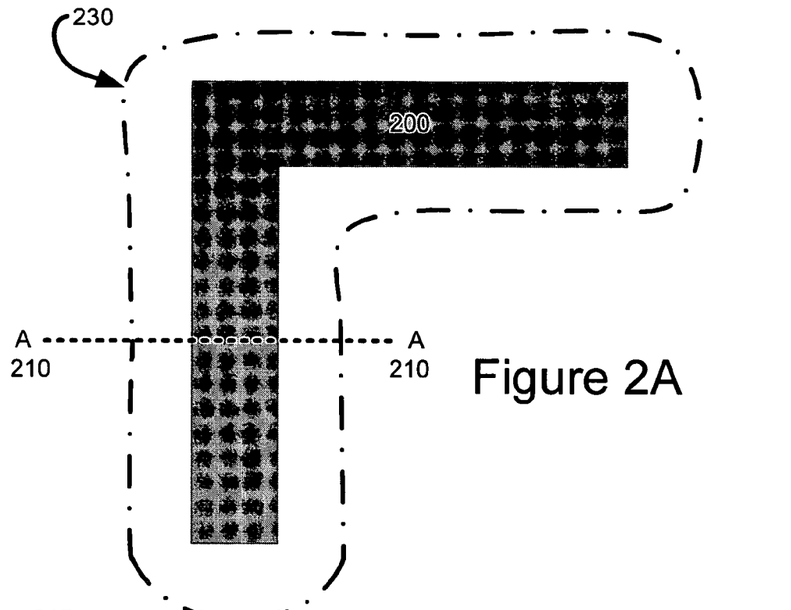
FIG. 2A is a plan view of a feature on a reticle.
Figure 2B:
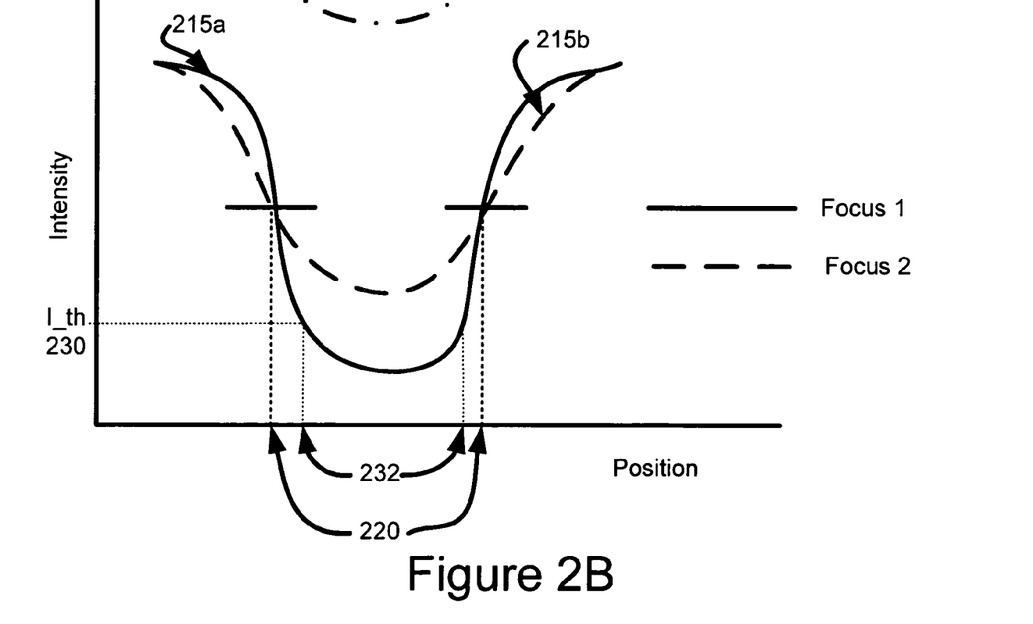
FIG. 2B is a graphical illustration of isofocal points at a cutline through the feature of FIG. 2A.

FIG. 2A is a plan view of a feature 200 on a reticle and FIG. 2B is a graphical illustration of intensity profiles 215a, 215b at varying focus values at a cutline 210 through the feature 200. In FIG. 2B, the graph represents the normalized intensity at positions across cutline A—A (210). The characteristic curves are known as intensity profiles 215a, 215b, which vary according to the focus value. An isofocal point 220 is located at the point where intensity profiles 215a, 215b intersect with each other, as illustrated in FIG. 2B. The isofocal point 220 is the point at which depth of focus is optimal, that is, at the position defined by the isofocal point 220, the intensity will remain constant regardless of focus value.

According to the present invention, the isofocal points 220 are expanded into two dimensions to form an "isofocal contour" 230 surrounding the feature 200. Thus, the isofocal contour 230 defines a continuous boundary around the feature 200 where the intensity remains constant regardless of focus value. Because the isofocal contour 230 captures both depth-of-focus and exposure latitude information, it is used to improve the OPC process.

Figure 3:
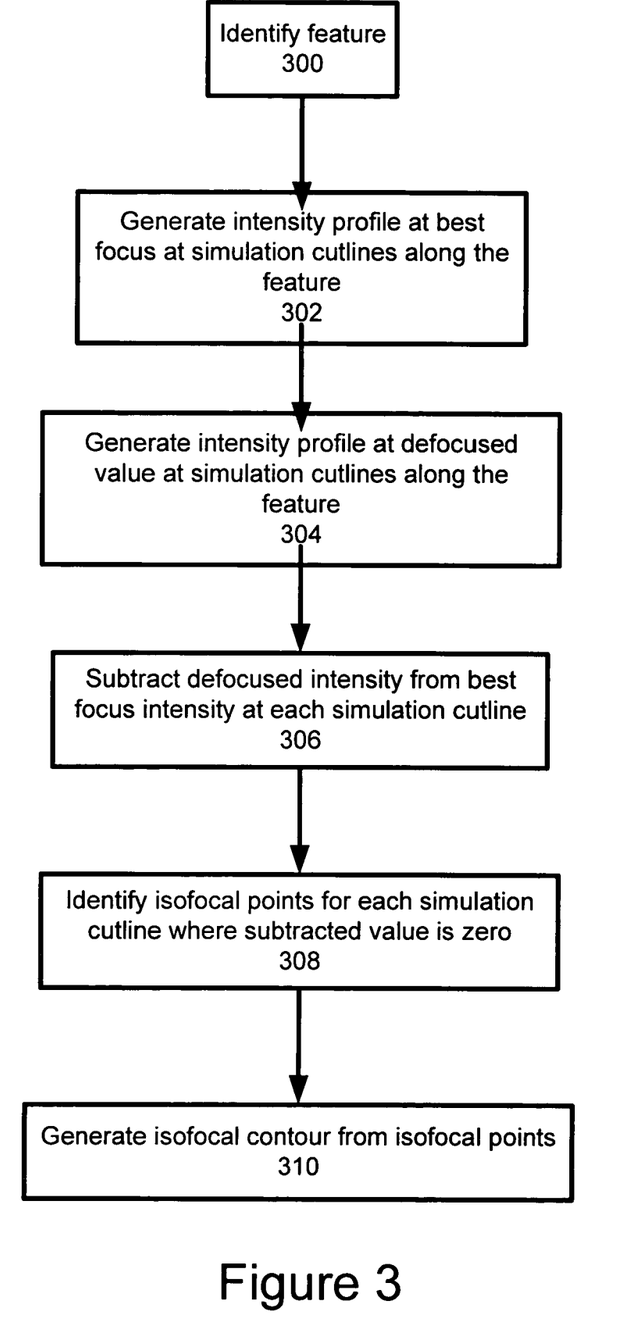
FIG. 3 is a flowchart illustrating a method for calculating the isofocal contour according to a preferred embodiment of the present invention.

FIG. 3 is a flowchart illustrating a method for calculating the isofocal contour 230 according to a preferred embodiment of the present invention. Referring to FIGS. 2A, 2B and 3, the process begins by identifying a feature 200 (step 300) on which OPC will be performed. An intensity profile 215a at a first focus value is generated either through experimentation or simulation at designated cutlines 210 along the entire feature 200 (step 302). The generation of the intensity profile 215a is well known to those skilled in the art and will not be described further herein. In a preferred embodiment, the first focus value is a best focus.

After the best focus intensity profile 215a has been generated, a second intensity profile 215b at a second focus value, preferably a defocused value, is generated at the cutlines 210 along the entire feature 200 (step 304). The defocused intensity profile 215b is then subtracted from the best focus intensity profile 215a (step 306) and the isofocal points 220 are identified for each cutline 210 along the entire feature 200 where the subtracted value is zero (step 308). Finally, the isofocal contour 230 is generated from the isofocal points 220 (step 310) via interpolation between cutlines 210.

As stated above, the isofocal contour captures both exposure latitude and depth of focus information. As such, it has been observed that the isofocal contour can be used to improve the efficiency and accuracy of the OPC process. In particular, the isofocal contour can be applied to improve the following OPC processes:

Model based subresolution assist feature optimization
Variable threshold model based OPC
Initial OPC Starting Point
Full Chip hot spot detection after OPC
Each process will be discussed below.

Model Based Subresolution Assist Feature Optimization

Figure 4A:
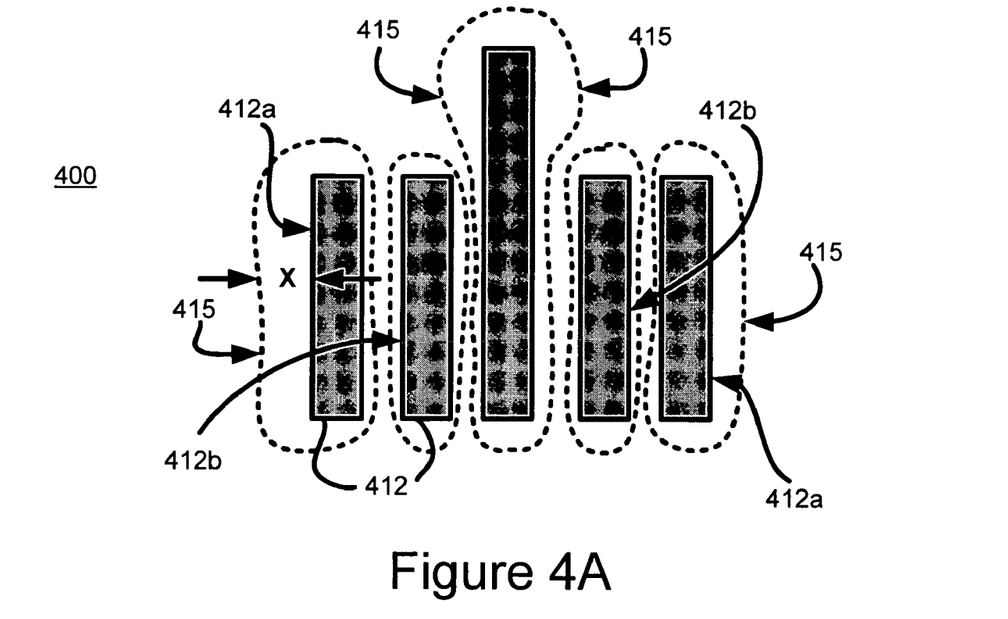
FIG. 4A is a plan view of the test pattern illustrated in FIG. 1 without the SRAFs.

As stated above, one technique for performing OPC utilizes subresolution assist features (SRAFs). FIG. 4A is a plan view of the test pattern illustrated in FIG. 1 without the SRAFs. As is shown, the pattern 400 includes five (5) features 412, an elongated feature surrounded by four shorter features. Also shown in FIG. 4A are the isofocal contours 415 of each feature 412. It has been observed that at open-ended surfaces 412a of the feature 412, the distance, X, between the isofocal contour 415 and the open-ended edge 412a is substantially greater than the distance between the isofocal contour 415 and an interior edge 412b of the feature 412. Thus, as is shown in FIG. 4A, the isofocal contour 415 "bulges" around edges 412a that are not proximate to other features 412.

Figure 4B:
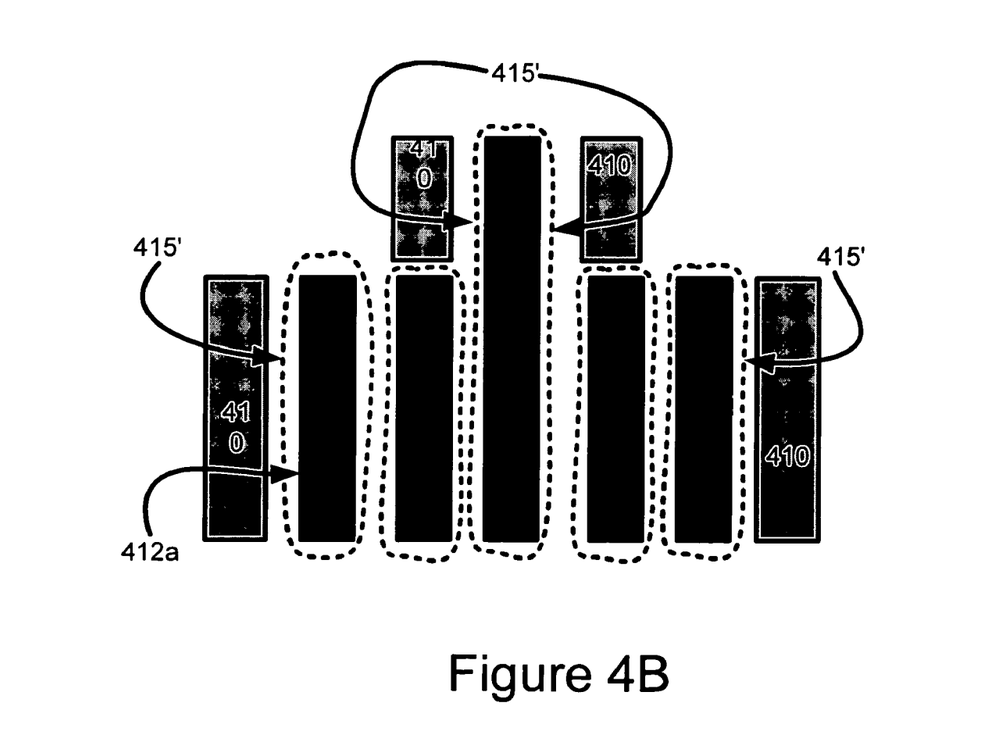
FIG. 4B is a test pattern with SRAFs.

FIG. 4B is a test pattern 400' with SRAFs 410. It has been observed that when the SRAFs 410 are placed in their optimal locations, i.e. where OPC is optimized, the distance between the isofocal contour 415' and the feature's edge 412a is minimal. In other words, the bulge in the isofocal contour 415' is eliminated. Based on this correlation, the optimal location of the SRAFs 410 can be accurately estimated by minimizing the distance between the isofocal contour 415' and the feature's edges 412a.

FIGS. 4A and 4B illustrate the advantages of utilizing SRAFs 410 to correct open-ended edges. Nevertheless, as stated above, correction using SRAFs 410 is not restricted to open-ended feature edges alone. As those skilled in the art appreciate, SRAFs 410 are also used to provide correction to other features, such as "intermediate pitch features," that exhibit poor depth of focus. Thus, an open ended feature edge is just one example of a feature that benefits from SRAFs 410.

Figure 5:
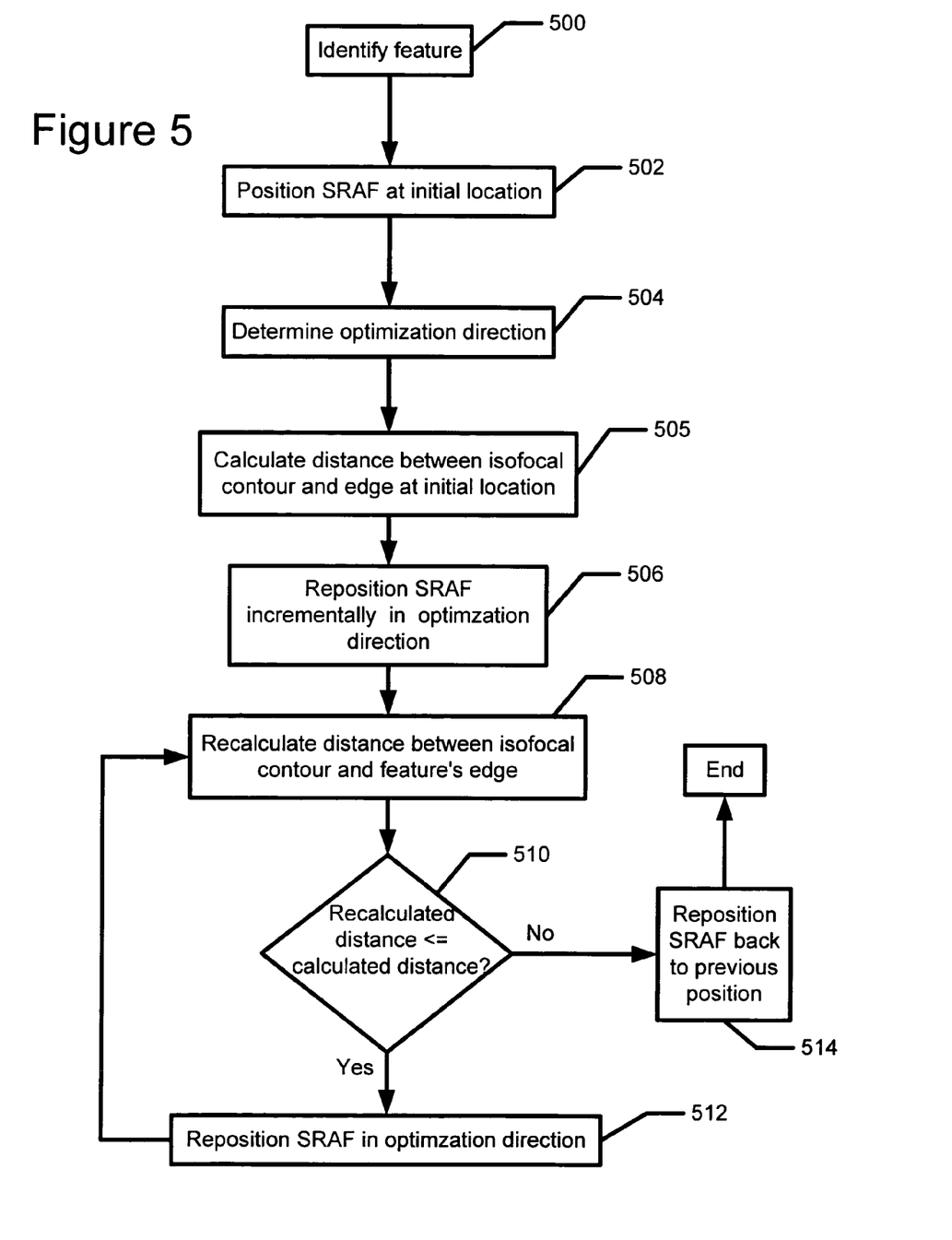
FIG. 5 is a flowchart illustrating a method for using the isofocal contour to position an SRAF according to a preferred embodiment of the present invention.

FIG. 5 is a flowchart illustrating a method for using the isofocal contour 415 to position an SRAF 410 according to a preferred embodiment of the present invention. Referring to FIGS. 4A, 4B and 5, the method begins by identifying a feature 412 (step 500) on which OPC will be performed. Preferably, the feature 412 is one that will benefit from the placement of the SRAF 410. In this example, the feature is one that has an open-ended edge 412a. Next, the SRAF 410 is positioned at an initial location near the feature's open-ended edge 412a (step 502). The initial location is determined by the minimum space design rule, i.e., the distance between the SRAF 410 and the open-ended edge 412a is greater than or equal to the minimum space allowed by the design. Those skilled in the art readily recognize that the minimum space allowed is a predetermined design parameter, and no further explanation is required.

Next, the optimization direction, i.e., the direction (closer or farther from the feature's edge) in which the SRAF 410 is repositioned, is determined (step 504). In a preferred embodiment, the optimization direction is determined by comparing the distances between the isofocal contour 415' and open-ended edge 412a as the SRAF 410 is moved incrementally closer to and farther from the edge 412a. The smaller of the distances indicates the optimization direction. For example, the distance between the isofocal contour 415' and the open-ended edge 412a, $X_0$, is calculated when the SRAF is in the initial location. Then, the SRAF 410 is repositioned closer to the open-ended edge 412a by a predetermined step size. The repositioning of the SRAF 410 changes the isofocal contour 415.' The distance between the isofocal contour 415' and the open-ended edge 412a, $X_{neg}$, is calculated. Next, the SRAF 410 is positioned farther from the edge 412a by a predetermined step size from the initial location. The distance between the isofocal contour 415' and the edge 412a, $X_{pos}$, is calculated. Distances $X_0$, $X_{neg}$, and $X_{pos}$ are compared. The smallest distance determines the optimization direction, i.e., closer to or farther from the edge 412a. Thus, if $X_{neg} < X_0$ and $X_{pos}$, then the location of the SRAF 410 will be optimized by moving the SRAF 410 in the direction closer to the edge 412a. Note that if $X_0$ is smallest, the initial location is the optimum position and no further optimization is required.

Once the optimization direction has been determined (step 504), the optimal location for the SRAF 410 can now be found. First, the distance between the isofocal contour 415' and the edge 412a is calculated for the initial location (step 505). Then the SRAF 410 is repositioned incrementally in the optimization direction (step 506). The distance between the isofocal contour 415' and the edge is then recalculated (step 508).

If the recalculated distance is less than or equal to the previous distance (step 510), the SRAF 410 is repositioned again in the optimization direction, e.g., either closer to or farther from the edge 412a (step 512), and the distance is recalculated (step 508). This process repeats until the recalculated distance is greater than the previously calculated distance (step 510). When this occurs, the optimum location of the SRAF 410 is estimated to be the previous position, and the SRAF 410 is repositioned back to that location (step 514).

Variable Threshold Model Based OPC

Another technique for performing OPC involves calculating a correction to the feature 200 based on a simulated resist image of the feature, known as a constant threshold contour (CTC). The CTC is determined by the feature 200 and the characteristics of the photoresist. For each type of resist, there is an intensity threshold value, $I_{th}$, whereby if the resist is exposed to an intensity value greater than the $I_{th}$, the resist will not image, and if the resist is exposed to an intensity value less than the $I_{th}$, the resist will image. Referring again to FIG. 2B, the intensity profile 215a at the first focus crosses the threshold intensity value 230 at CTC points 232. Thus, the CTC is formed by calculating CTC points 232 along the feature 200.

Any correction is based on the difference between an actual resist image and the desired feature. Therefore, the closer the CTC matches the actual resist image, the better the correction. It has been observed that while the CTC closely matches the actual resist image along a line feature, the CTC deviates from the actual resist image most noticeably at the line ends. Also, the CTC value for aerial images or diffused aerial images tends to be dependent on feature size and feature type. This is due to the fact that the latent image formation involves nonlinear diffusion that is not captured by a simple aerial image model or a diffused aerial image model. Another contributing factor is that the threshold intensity of real, i.e., non-ideal, resist is actually a range of values as opposed to one constant value.

Figure 6:
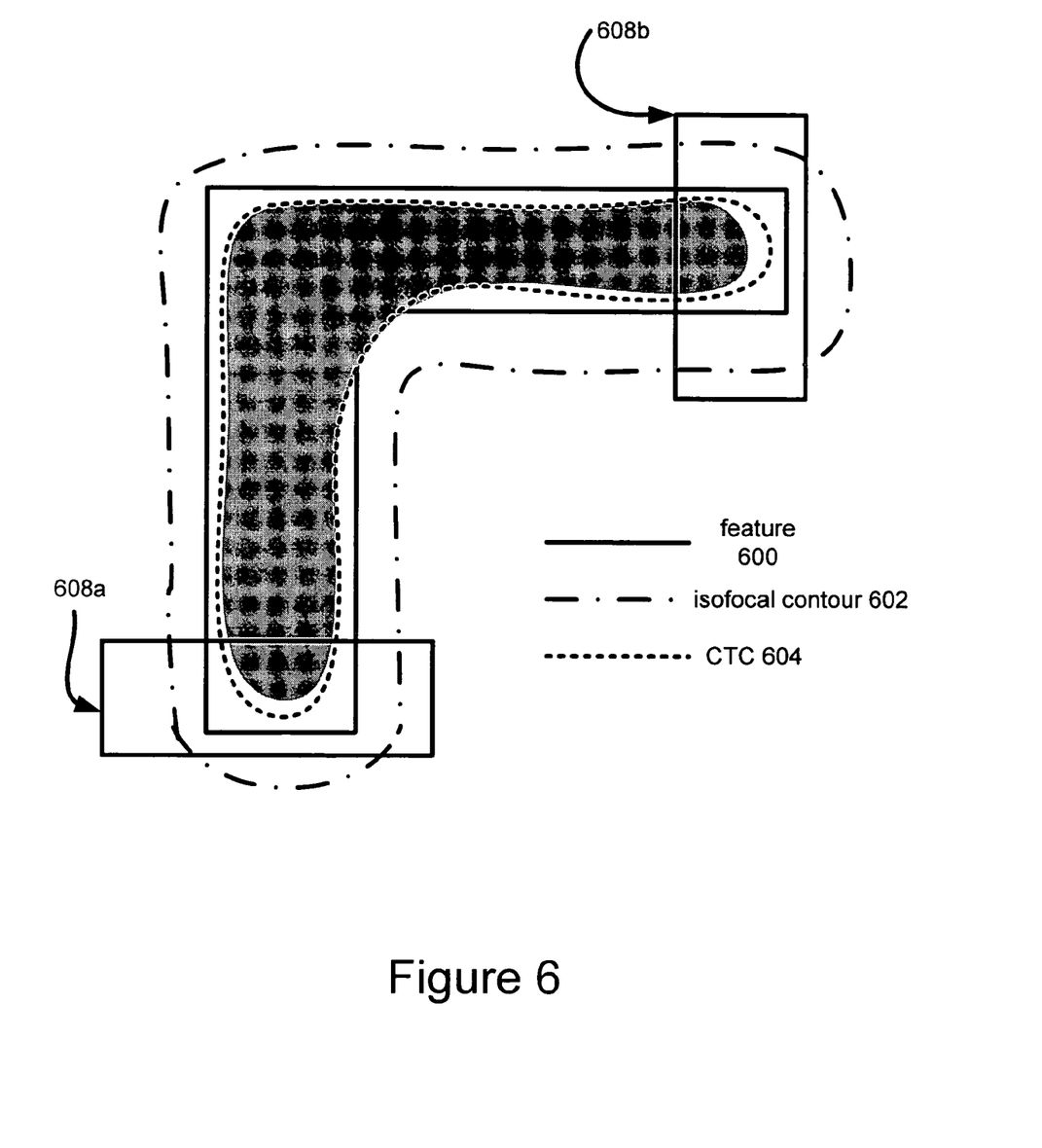
FIG. 6 is a plan view of a feature on which OPC is performed.

FIG. 6 is a plan view of a feature 600 on which OPC is performed. The isofocal contour 602 encompasses the feature edge 600. The shaded area represents the actual resist image 606 and the CTC 604 generally traces the periphery of the actual resist image 606. Note that the CTC 604 deviates from the actual resist image 606 at the areas designated by boxes 608a and 608b. In those areas, CTC-based correction will not be effective because the CTC 604 does not accurately reflect the actual resist image 606.

Figure 7A:
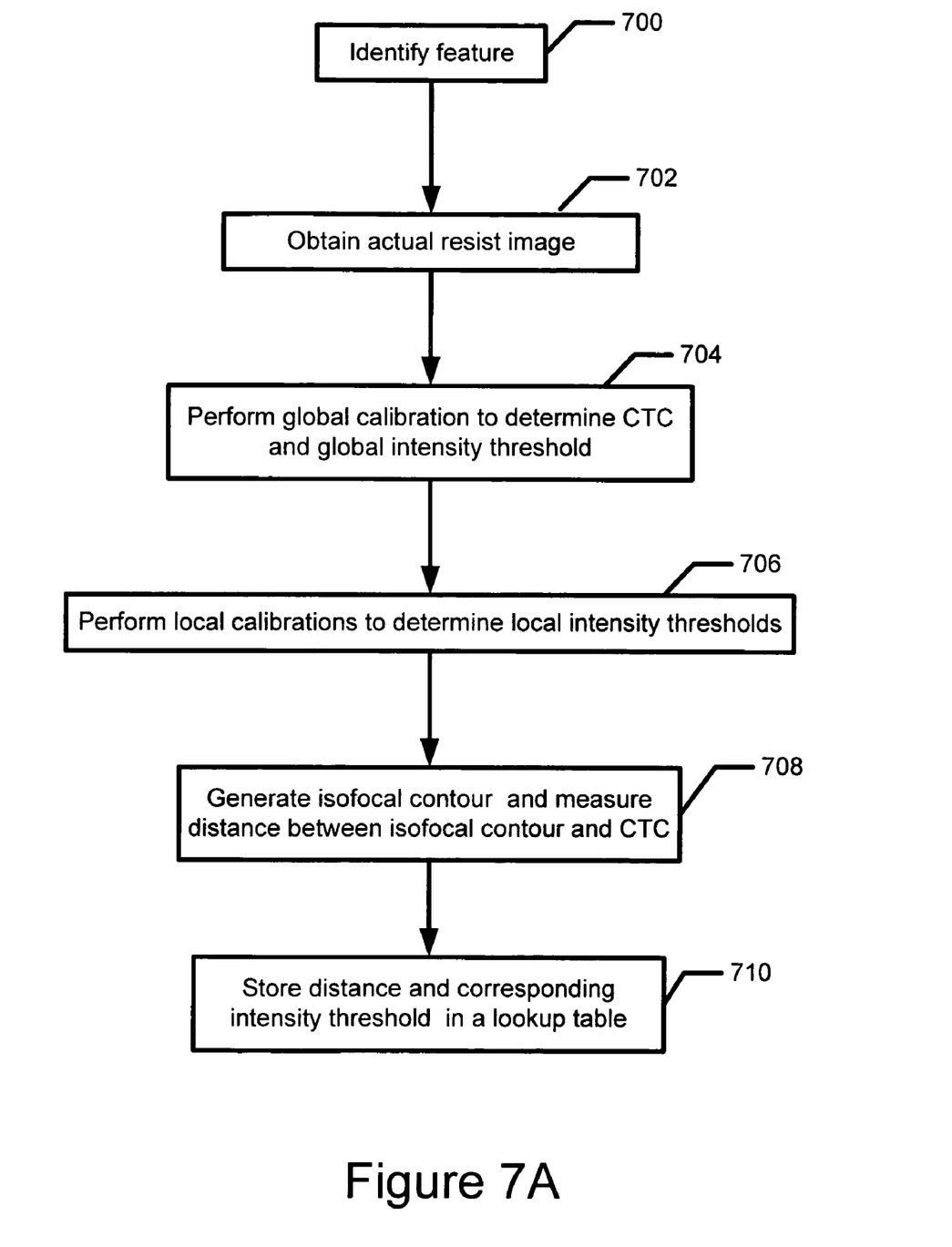
FIGS. 7A and 7B are flowcharts illustrating a method for improving CTC-based OPC according to a preferred embodiment of the present invention.
Figure 7B:
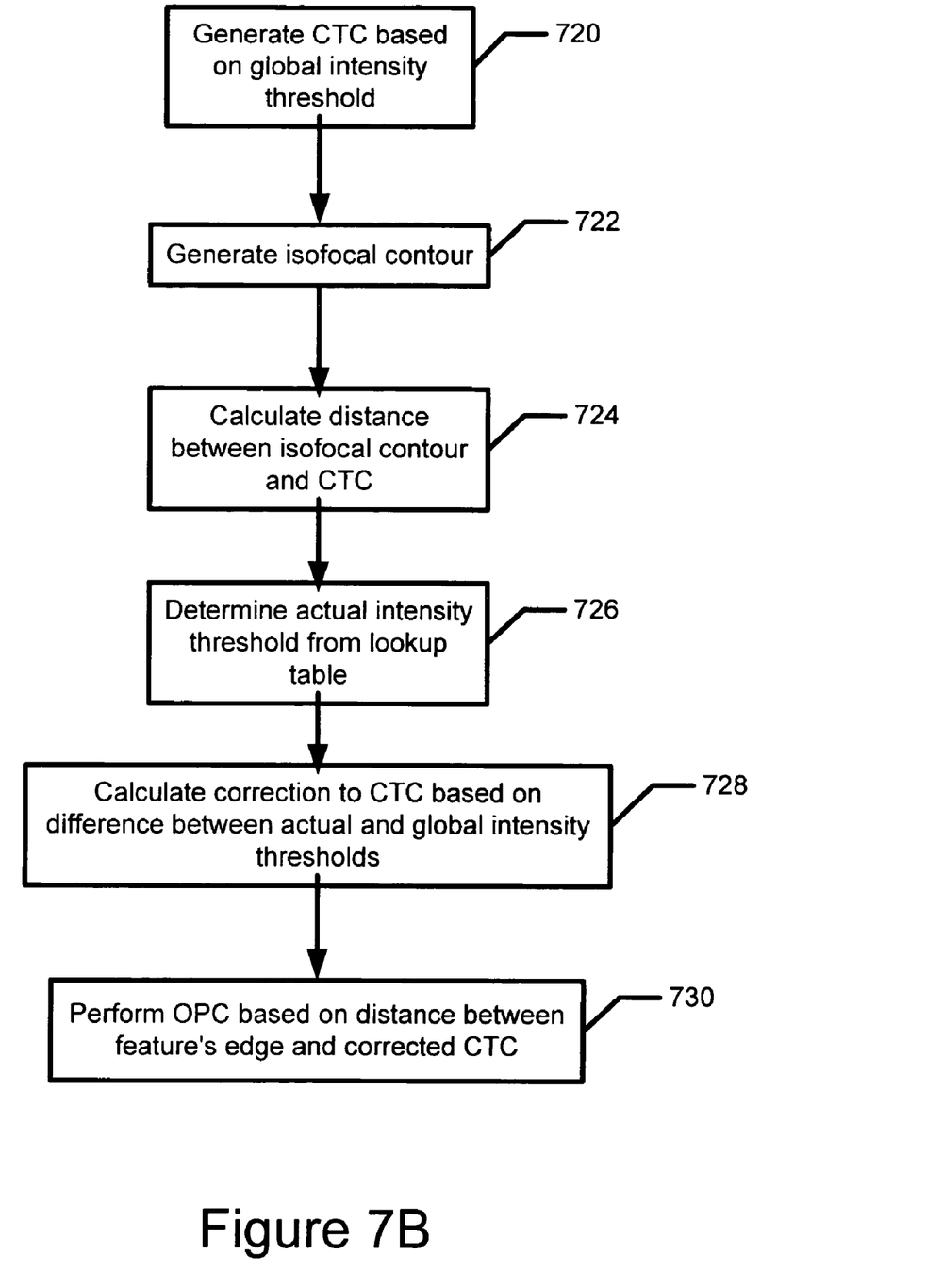

According to the preferred embodiment of the present invention, the isofocal contour 602 can be used to improve the accuracy of the CTC 604 so that the CTC-based correction technique is more effective for the entire feature 600. FIGS. 7A and 7B are flowcharts illustrating a method for improving CTC-based OPC according to a preferred embodiment of the present invention. In particular, FIG. 7A illustrates a method for calibrating the model, and FIG. 7B illustrates a process for refining the CTC 604.

Referring to FIGS. 6 and 7A, the calibration process starts by identifying a feature 600 on which OPC will be performed (step 700). Next, the actual resist image 606 is obtained (step 702). Preferably, the actual resist image 606 on a wafer is captured in a scanning electron micrograph (SEM) and uploaded into the OPC system. Next, a global calibration between the actual resist image 606 and the feature 600 is performed at a best focus to determine a global intensity threshold, $I_{global}$, and from it, the CTC 604 (step 704). The global intensity threshold is characteristic of the resist type, and therefore is different for different resist types.

Once the global intensity threshold has been determined, local calibrations are performed (step 706) in regions where the CTC 604 deviates significantly from the actual resist image 606, e.g., at the line ends 608a, 608b. Through the local calibrations, local intensity thresholds, $I_{local}$, are determined. Thus, if $I_{local}$, as opposed to $I_{global}$, were used to determine the CTC 604 in this region, the CTC 604 would better reflect the actual resist image 606. Note that if the local calibration is performed in a region where the CTC 604 does not deviate significantly from the actual resist image 606, the difference between the $I_{local}$ and the $I_{global}$ will be neglible.

Next, the isofocal contour 602 is generated (preferably using the process described in FIG. 3), and the distance between the isofocal contour 602 and the CTC 604 (measured along a line normal to the CTC 604) is calculated (step 708). Based on the global and local calibrations, the distance between the isofocal contour 602 and the CTC 604 can be correlated to a local intensity threshold value. This data is preferably stored in a lookup table (step 710) for later use during an OPC procedure. In another preferred embodiment, a model fit can be performed to generate an analytic expression of the form: $I_{local}$=f (dist(isofocal contour, CTC)).

Referring to FIGS. 6 and 7B, the process for refining the CTC 604 for a feature 600 during OPC begins by generating the CTC 604 based on the global intensity threshold value associated with the resist (step 720). This value was determined during the model calibration process at step 704 (FIG. 7A). Next, the isofocal contour 602 is generated (step 722). The distance between the isofocal contour 602 and the CTC 604 is then calculated (step 724) at various points along the CTC 604.

To determine the correction to the CTC 604 at a particular point, the lookup table is used to determine the local intensity threshold value corresponding to the distance between CTC 604 and the isofocal contour 602 at that point (step 726). The correction to the CTC 604 is calculated in step 728. In the preferred embodiment, the correction is based on the difference between the local intensity threshold value and the global intensity threshold value. In particular, the correction to the CTC 604 can be calculated using the following equation:

$$CTC_{corrected} = CTC_{global} + [(I_{local} - I_{global})/m_{CTC}]$$

where $m_{CTC}$ is the aerial image slope at the point on the CTC 604.

Once the CTC 604 has been corrected in this manner, the corrected CTC more closely tracks the actual resist image 606, even at the line ends 608a, 608b. OPC can now be performed based on the distance between the corrected CTC and the feature's edge 600 (step 730).

Initial OPC Starting Point

Figure 8:
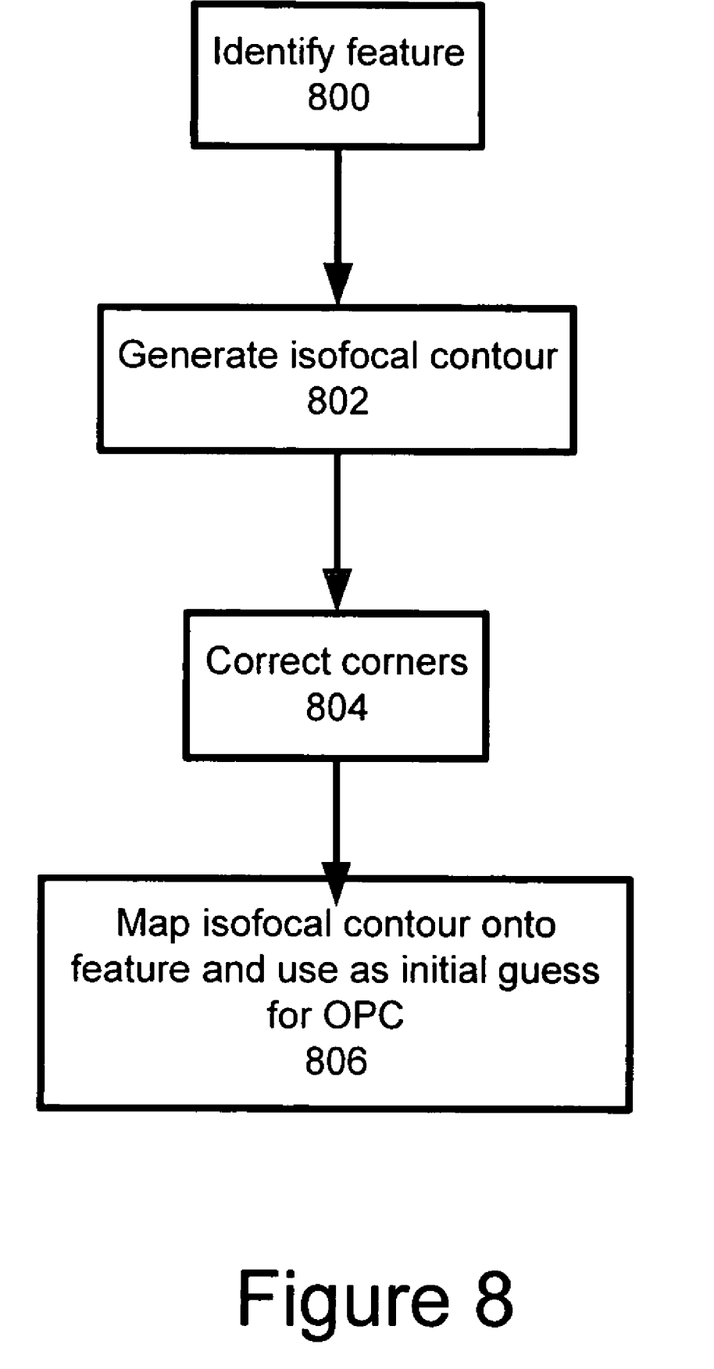
FIG. 8 is a flowchart illustrating a method for using the isofocal contour as an initial estimation for OPC according to a preferred embodiment of the present invention.

As stated above, it has been observed that after OPC, the corrected feature roughly coincides with the isofocal contour of the uncorrected feature. Thus, the isofocal contour of a feature can be used as a starting point for OPC. FIG. 8 is a flowchart illustrating a method for using the isofocal contour as an initial estimate for OPC according to a preferred embodiment of the present invention.

Referring to FIGS. 2A and 8, the process starts by identifying a feature 200 on which OPC will be performed (step 800). Next, the isofocal contour 230 is generated for the feature 200 (step 802), preferably by the process described in FIG. 3. Then, if the feature 200 has corners, the corners are corrected (step 804) utilizing standard OPC techniques. For example, the correction for concave corners entails subtracting from the feature 200, while the correction for convex corners entails adding to the feature 200. Finally, the isofocal contour 230 is mapped onto the feature 200 and used as the initial estimate for OPC (step 806).

By using the isofocal contour 230 as the initial estimate, it has been observed that the number of iterations needed to optimize OPC is significantly reduced, e.g., two (2) iterations as opposed to six (6). Thus, the OPC process is faster and less costly.

Full Chip Hot Spot Detection After OPC

After OPC has been performed on an IC mask design, the isofocal contour can be used to identify portions of the design that may present processing difficulties. For example, if features are placed too close to one another, the respective isofocal contours of the features will merge. Such a merge, known as "bridging," indicates that the optical process will have difficulties resolving the features. Also, the distance, X, between the isofocal contour and the corrected feature's edge can be used as an indicator of process failure. For example, an uncharacteristically large distance, X, between the isofocal contour and the edge is indicative of a poor depth of focus at that edge. This will result in process failure.

Figure 9:
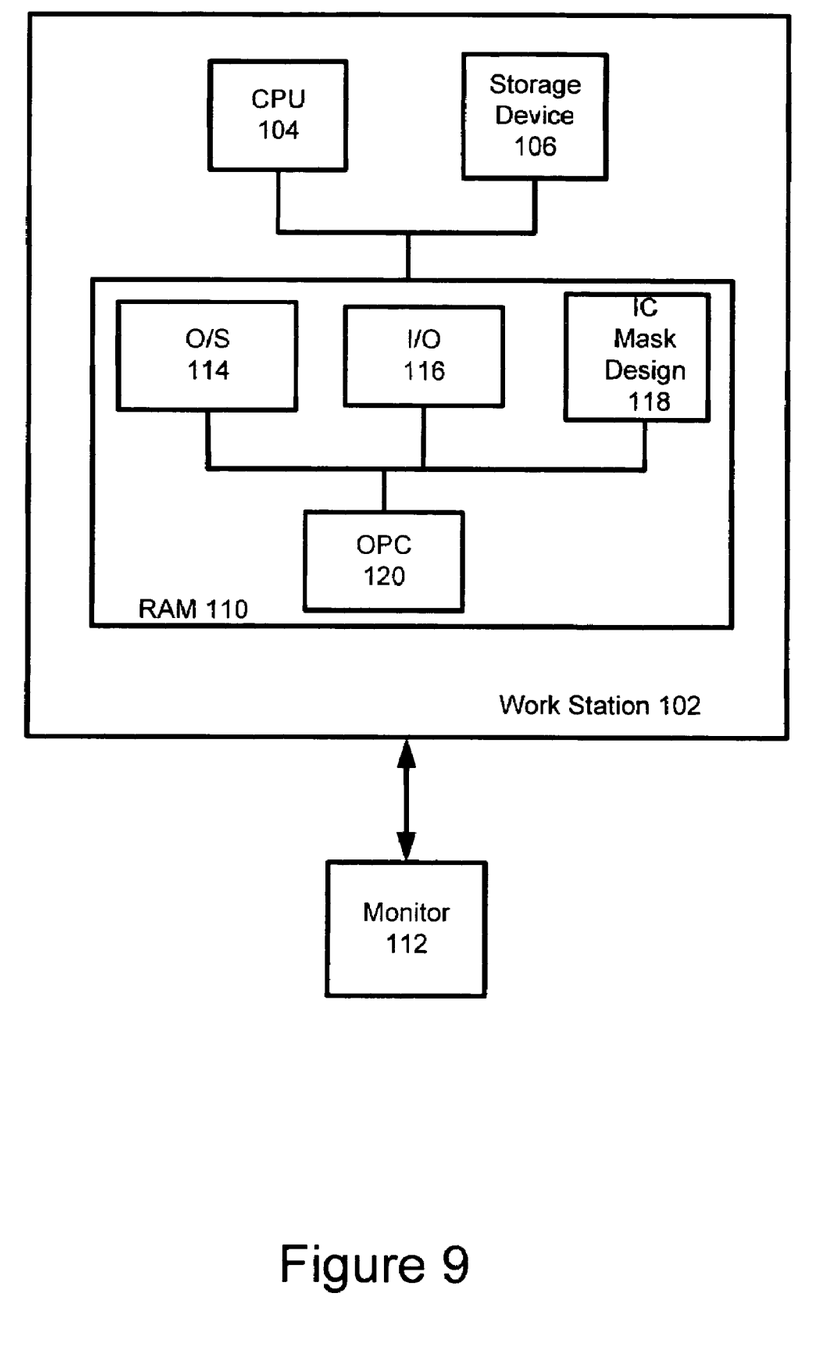
FIG. 9 is a block diagram illustrating an environment in which the present invention may operate.

The present invention is implemented as a software program, which in a preferred embodiment, operates on an engineering workstation or other type of computer system 102, as shown in FIG. 9, which is a block diagram illustrating an environment in which the present invention may operate. The workstation 102 includes a microprocessor 104 that is coupled to a non-volatile storage device 106, e.g., a conventional hard disk storage device. The microprocessor 104 and the hard disk storage device 106 are coupled to a volatile storage device 110, e.g. a random access memory (RAM). A monitor 112, is coupled to the workstation 102 for displaying a user interface.

The RAM 110 stores, during operation, an operating system (O/S) 114, e.g., UNIX, a conventional input/output (I/O) module 116, an IC mask design 118, and an optical proximity correction (OPC) module 120. The IC mask design 118 is submitted by a designer (not shown) via the input/output (I/O) module 116. Preferably, the IC mask design 118 is described in some format, e.g., GDS II, which allows the OPC module 120 to interpret the design. The OPC module 120 includes programming instructions that execute the OPC optimization processes described above and illustrated in FIGS. 3, 5, 7A, 7B and 8.

A method and system for performing optical proximity correction on an integrated circuit (IC) mask design has been disclosed. According to the preferred embodiment, isofocal points corresponding to points on the edge of a feature are expanded to form an isofocal contour around the feature. Because the isofocal contour captures depth of focus and exposure latitude information, it is used to improve the OPC process for the feature. By using the isofocal contour as a guide or as an indicator, various OPC processes, e.g., SRAF placement and initial estimation, are expedited and less costly.

The present invention has been described in accordance with the embodiments shown, and one of ordinary skill in the art will readily recognize that there could be variations to the embodiments. For example, although the description above discusses using the isofocal contour to improve specific OPC processes, those skilled in the art would appreciate that the isofocal contour could be utilized in other OPC techniques not described herein. Those uses would be within the spirit and scope of the present invention. Accordingly, many modifications may be made by one of ordinary skill in the art without departing from the spirit and scope of the appended claims.

What is claimed is:

1. A computer-implemented method for performing optical proximity correction (OPC) on an integrated circuit (IC) mask design, the method comprising:
   (a) identifying a feature in the IC mask design;
   (b) generating an isofocal contour for the identified feature, wherein the isofocal contour is a continuum of isofocal points corresponding to points on an edge of the identified feature; and
   (c) utilizing the isofocal contour to estimate an amount of correction needed to produce a resist image significantly identical to the identified feature.

2. The method of claim 1, wherein step (b) further includes:
   (b1) generating an intensity profile of the identified feature at a first focus value;

(b2) generating an intensity profile of the identified feature at a second focus value; and (b3) calculating a difference between the intensity profiles at the first focus value and the second focus value, wherein the isofocal contour is determined where the difference is zero.

3. The method of claim 2, wherein the first focus value is a best focus value and the second focus value is a defocused value.

4. The method of claim 1, wherein the utilizing step (c) includes:

c1) estimating an optimal position of a subresolution assist feature adjacent to an edge of a feature based on a distance between the edge of the feature and the feature's isofocal contour adjacent to the edge.

5. The method of claim 4, wherein the determining step (c1) includes:

c1i) positioning the subresolution assist feature near the edge of the feature;

c1ii) measuring the distance between the edge and the isofocal contour;

c1iii) repositioning the subresolution assist feature;

c1iv) remeasuring the distance between the edge and the isofocal contour;

c1v) if the remeasured distance is greater than the previously measured distance, repositioning the subresolution assist feature at the previous position; and c1vi) if the remeasured distance is less than the previously measured distance, repeating steps (c1iii) and (c1iv).

6. The method of claim 1, wherein the utilizing step (c) includes:

c1) mapping the isofocal contour onto the identified feature; and c2) using the mapped isofocal contour as a correction starting point.

7. The method of claim 1, wherein the utilizing step (c) includes:

c1) calculating a correction to a constant threshold contour based on a distance between the constant threshold contour and the isofocal contour, wherein the distance between the constant threshold contour and the isofocal contour is correlated to a local intensity threshold value, which is used to calculate the correction to the constant threshold contour.

8. The method of claim 7, wherein the utilizing step (c) further includes:

c2) prior to calculating the correction, calibrating a resist type by performing a global calibration between an actual resist image of a feature and the feature to determine a global intensity threshold value for the resist;

c3) calculating a constant threshold contour based on the global intensity threshold value;

c4) performing a local calibration in a region of the feature between the actual resist image in the region and the feature to determine a local intensity threshold value for the region;

c5) generating an isofocal contour;

c6) measuring the distance between the isofocal contour and the constant threshold contour;

c7) correlating the measured distance at a point on the constant threshold contour to the local intensity threshold value at the point; and c8) storing distance and correlated local intensity threshold value data in a lookup table.

9. The method of claim 1 further comprising:

(d) identifying a next feature in the IC mask design; and (e) repeating steps (b) and (c) until all features have been corrected.

10. The method of claim 9 further comprising:

(f) generating isofocal contours of the corrected features of the IC mask design; and (g) examining the generated isofocal contours to identify potential process failure.

11. A computer readable medium containing programming instructions for performing optical proximity correction (OPC) on an integrated circuit (IC) mask design, the programming instructions include:

(a) identifying a feature in the IC mask design;

(b) generating an isofocal contour for the identified feature, wherein the isofocal contour is a continuum of isofocal points corresponding to points on an edge of the identified feature; and (c) utilizing the isofocal contour to estimate an amount of correction needed to produce a resist image significantly identical to the identified feature.

12. The computer readable medium of claim 11, wherein instruction (b) further includes:

(b1) generating an intensity profile of the identified feature at a first focus value;

(b2) generating an intensity profile of the identified feature at a second focus value; and (b3) calculating a difference between the intensity profiles at the first focus value and the second focus values, wherein the isofocal contour is determined where the difference is zero.

13. The computer readable medium of claim 12, wherein the first focus value is a best focus value and the second focus value is a defocused value.

14. The computer readable medium of claim 11, wherein instruction (c) includes:

c1) estimating an optimal position of a subresolution assist feature adjacent to an edge of a feature based on a distance between the edge of the feature and the feature's isofocal contour adjacent to the edge.

15. The computer readable medium of claim 14, wherein instruction (c1) includes:

c1i) positioning the subresolution assist feature near the edge of the feature;

c1ii) measuring the distance between the edge and the isofocal contour;

c1iii) repositioning the subresolution assist feature;

c1iv) remeasuring the distance between the edge and the isofocal contour;

c1v) if the remeasured distance is greater than the previously measured distance, repositioning the subresolution assist feature at the previous position; and c1vi) if the remeasured distance is less than the previously measured distance, repeating steps (c1iii) and (c1iv).

16. The computer readable medium of claim 11, wherein instruction (c) includes:

c1) mapping the isofocal contour onto the identified feature; and c2) using the mapped isofocal contour as a correction starting point.

17. The computer readable medium of claim 11, wherein instruction (c) includes:

c1) calculating a correction to a constant threshold contour based on a distance between the constant threshold contour and the isofocal contour, wherein the distance between the constant threshold contour and the isofocal contour is correlated to a local intensity threshold value, which is used to calculate the correction to the constant threshold contour.

18. The computer readable medium of claim 17, wherein instruction (c) further includes:
- c2) prior to calculating the correction, calibrating a resist type by performing a global calibration between an actual resist image of a feature and the feature to determine a global intensity threshold value for the resist;
- c3) calculating a constant threshold contour based on the global intensity threshold value;
- c4) performing a local calibration in a region of the feature between the actual resist image in the region and the feature to determine a local intensity threshold value for the region;
- c5) generating an isofocal contour;
- c6) measuring the distance between the isofocal contour and the constant threshold contour;
- c7) correlating the measured distance at a point on the constant threshold contour to the local intensity threshold value at the point; and
- c8) storing distance and correlated local intensity threshold value data in a lookup table.

19. The computer readable medium of claim 11 the programming instructions further comprising:
- (d) identifying a next feature in the IC mask design; and
- (e) repeating instructions (b) and (c) until all features have been corrected.

20. The computer readable medium of claim 19 the programming instructions further comprising:
- (f) generating isofocal contours of the corrected features of the IC mask design; and
- (g) examining the generated isofocal contours to identify potential process failure.

21. A system for performing optical proximity correction (OPC) on an integrated circuit (IC) mask design comprising:
- a microprocessor;
- a storage device coupled to the microprocessor, wherein the storage device includes:
- an input/output module;
- an IC mask design; and
- an OPC module, wherein the OPC module includes programming instructions for identifying a feature in the IC mask design, generating an isofocal contour for the identified feature, wherein the isofocal contour is a continuum of isofocal points corresponding to points on an edge of the identified feature, and utilizing the isofocal contour to estimate an amount of correction needed to produce a resist image significantly identical to the identified feature.

22. The system of claim 21, wherein the programming instructions for generating an isofocal contour including instructions for generating an intensity profile of the identified feature at a first focus value, generating an intensity profile of the identified feature at a second focus value, and calculating a difference between the intensity profiles at the first focus value and the second focus values, wherein the isofocal contour is determined where the difference is zero.

23. The system of claim 21, wherein the OPC module utilizes the isofocal contour for estimating an optimal position of a subresolution assist feature adjacent to an edge of a feature based on a distance between the edge of the feature and the feature's isofocal contour adjacent to the edge.

24. The system of claim 21, wherein the OPC module utilizes the isofocal contour as a correction starting point.

25. The system of claim 21, wherein the OPC module utilizes the isofocal contour to refine a constant threshold contour such that the constant threshold contour matches an actual resist image of the identified feature.

26. The system of claim 21, wherein the OPC module further includes programming instructions for identifying a next feature in the IC mask design, and repeating the instructions for generating the isofocal contour and utilizing the isofocal contour until all features have been corrected.

27. The system of claim 26, wherein the OPC module further includes programming instructions for generating isofocal contours of the corrected features of the IC mask design, and examining the generated isofocal contours to identify potential process failure.

* * * * *